US010001528B1

(12) United States Patent
Matsuyama et al.

(10) Patent No.: US 10,001,528 B1
(45) Date of Patent: Jun. 19, 2018

(54) BATTERY DETERIORATION DEGREE ESTIMATING APPARATUS AND ESTIMATING METHOD

(71) Applicant: Nissan Motor Co., Ltd., Yokohama-shi, Kanagawa (JP)

(72) Inventors: Chizuru Matsuyama, Kanagawa (JP); Kenji Hosaka, Kanagawa (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 0 days. days.

(21) Appl. No.: 15/578,122

(22) PCT Filed: May 29, 2015

(86) PCT No.: PCT/JP2015/065669
§ 371 (c)(1),
(2) Date: Nov. 29, 2017

(87) PCT Pub. No.: WO2016/194082
PCT Pub. Date: Dec. 8, 2016

(51) Int. Cl.
*G01N 27/416* (2006.01)
*G01R 31/36* (2006.01)
(Continued)

(52) U.S. Cl.
CPC ..... *G01R 31/3679* (2013.01); *G01R 31/3651* (2013.01); *H01M 10/425* (2013.01);
(Continued)

(58) Field of Classification Search
CPC ........... G01R 31/3679; G01R 31/3651; H01M 10/486; H01M 10/425; H01M 2220/20; H01M 2010/4278
(Continued)

(56) References Cited

U.S. PATENT DOCUMENTS

2014/0320144 A1* 10/2014 Nakaya ................. H01M 10/54
324/434
2015/0372514 A1* 12/2015 Kobayashi .......... H01M 10/482
320/134
2017/0264110 A1* 9/2017 Toya ..................... H02J 7/0021

FOREIGN PATENT DOCUMENTS

| JP | 2007195312 A | 8/2007 |
| JP | 2013120640 A | 6/2013 |
| JP | 2015081823 A | 4/2015 |

* cited by examiner

*Primary Examiner* — Giovanni Astacio-Oquendo
(74) *Attorney, Agent, or Firm* — Young Basile Hanlow & MacFarlane, P.C.

(57) ABSTRACT

A battery deterioration degree estimating apparatus includes a storage deterioration degree estimator that estimates the storage deterioration degree of the battery in reuse based on the storage deterioration degree of the battery in the in-vehicle period and the load information of the battery in reuse, the cycle deterioration degree estimator that estimates the cycle deterioration degree of the battery in reuse on the basis of the load information of the battery in reuse, and the total-deterioration-degree at secondary-use-start calculator that calculates the total deterioration degree of the battery at the time point of reuse start. The battery deterioration degree estimating apparatus includes the total-deterioration-degree detector that estimates the total deterioration degree of the battery after the reuse start on the basis of the storage deterioration degree in reuse, the cycle deterioration degree in reuse, and the total deterioration degree of the battery at the time point of the reuse start.

8 Claims, 10 Drawing Sheets

(51) Int. Cl.
*H01M 10/48* (2006.01)
*H01M 10/42* (2006.01)

(52) U.S. Cl.
CPC .. *H01M 10/486* (2013.01); *H01M 2010/4278* (2013.01); *H01M 2220/20* (2013.01)

(58) Field of Classification Search
USPC .......................................... 324/425, 426, 427
See application file for complete search history.

BATTERY DETERIORATION DEGREE ESTIMATING APPARATUS AND ESTIMATING METHOD

TECHNICAL FIELD

The present invention relates to a battery deterioration degree estimating apparatus and an estimating method.

BACKGROUND

A battery (a secondary battery) deteriorates at a speed corresponding to a usage environment. With the deterioration, an amount of charge at a full charge decreases and discharge characteristics deteriorate. Deterioration of a battery mounted on a vehicle causes deterioration of a running performance. Therefore, it is preferable that a time period capable of providing a predetermined performance for the battery is estimated in advance. A technique in JP2007-195312A estimates a battery deterioration degree associating with a square root of a total running distance to predict a residual life.

However, the method of JP2007-195312A estimating the battery deterioration degree on the basis of the square root of the total running distance has a problem where an estimation error is large.

SUMMARY

It is an object of the present invention to provide a technique for accurately estimating a battery deterioration degree.

According to one embodiment of the present invention, a battery deterioration degree estimating apparatus that uses the information on the battery deterioration degree in an in-vehicle period to estimate the deterioration degree of the battery in reuse is provided. The battery deterioration degree estimating apparatus includes the storage deterioration degree estimator that estimates the storage deterioration degree of the battery in reuse on the basis of the information on the storage deterioration degree of the battery in the in-vehicle period and the load information of the battery in reuse, the cycle deterioration degree estimator that estimates the cycle deterioration degree of the battery in reuse on the basis of the load information of the battery in reuse, and the total-deterioration-degree at secondary-use-start calculator that calculates the total deterioration degree of the battery at the time point of reuse start. The battery deterioration degree estimating apparatus includes the total-deterioration-degree detector that estimates the total deterioration degree of the battery after the reuse start on the basis of the storage deterioration degree in reuse, the cycle deterioration degree in reuse, and the total deterioration degree of the battery at the time point of the reuse start.

The following describes the embodiments of the present invention in detail with accompanying drawings.

DESCRIPTION OF THE EMBODIMENTS

First Embodiment

As described above, a residual life of a battery is preferably estimated as accurately as possible. The battery residual life to be estimated is not limited to a residual life estimated in use on the vehicle, but a residual life in reuse (secondary use) after the use on the vehicle (primary use) is preferably estimated as accurately as possible. Low estimation accuracy of the battery residual life in reuse causes a reuse plan of the battery, for example, in what sort of usage the battery can be employed and how many years the battery can be used, to be loose. Consequently, the battery after the primary use failing to find an appropriate way of reuse is treated as spare battery inventory, thus increasing inventory control cost. Note that, the secondary use means using the battery to supply an electric power to a load different from the case of the primary use, for example, the battery used on the vehicle (the primary use) is used as a stationary battery or used mounted on a vehicle different from the case of the primary use, and the secondary use is not limited to a purpose (the load to which the battery supplies the electric power) in the secondary use of the battery.

To solve the problem, it is an object of a battery deterioration degree estimating apparatus according to the present invention to accurately estimate a deterioration degree in reuse of a battery after a use on a vehicle (a primary use) before starting a secondary use of the battery. The following describes a battery deterioration degree estimating apparatus of a first embodiment in detail with reference to drawings and similar description.

Figure 1:
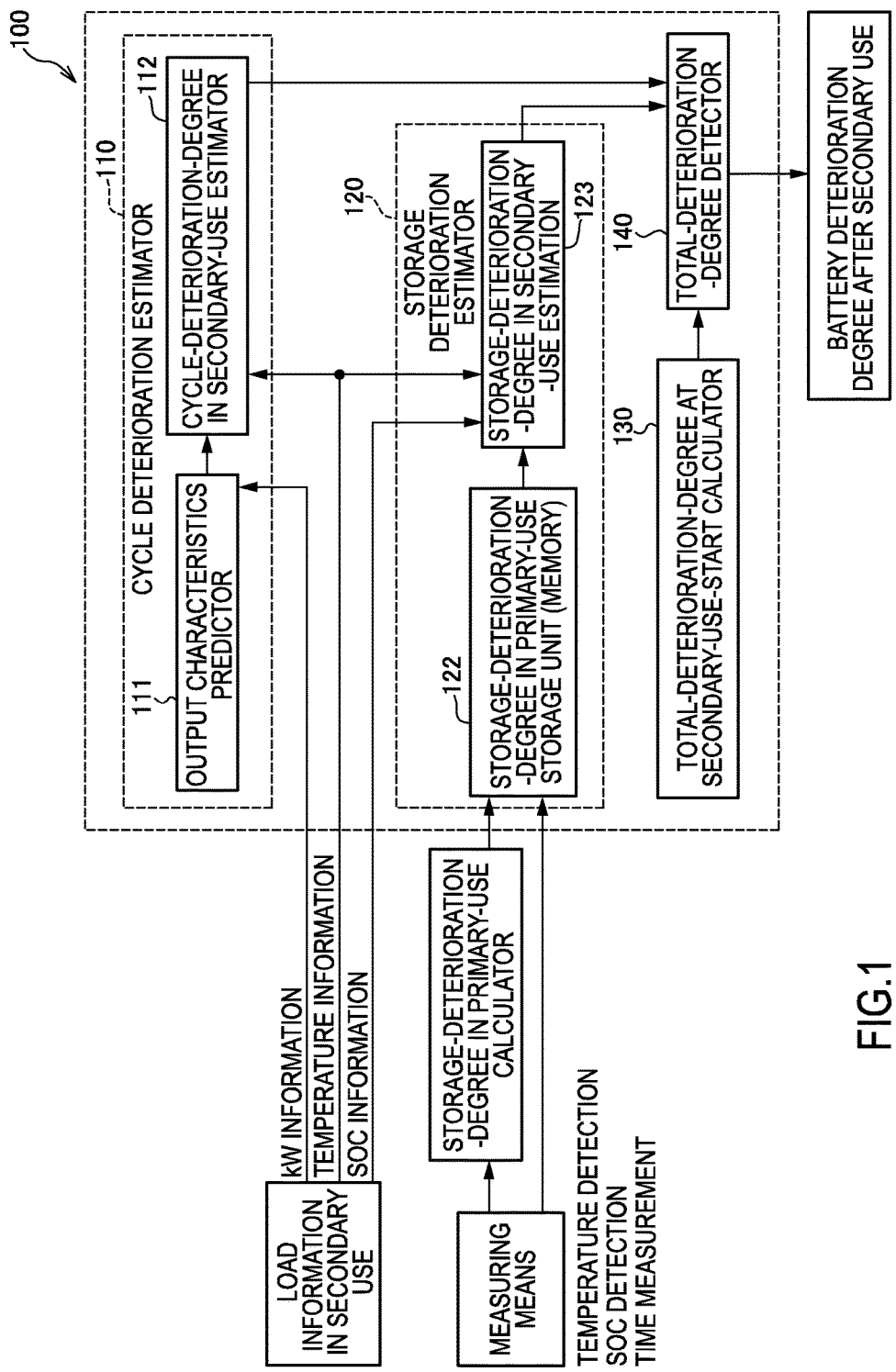
FIG. 1 is a block diagram illustrating a configuration of a battery deterioration degree estimating apparatus of a first embodiment.

FIG. 1 is a block diagram illustrating a configuration of the battery deterioration degree estimating apparatus of the first embodiment.

A battery deterioration degree estimating apparatus 100 of this embodiment mainly includes a cycle deterioration estimator 110, a storage deterioration estimator 120, a total-deterioration-degree at secondary-use-start calculator (a total-deterioration-degree at reuse-start calculator) 130, and a total-deterioration-degree detector 140.

Here, before the descriptions of the respective configurations, battery deterioration will be described. The battery deterioration is broadly divided into storage deterioration that occurs with time inside the battery due to mainly chemical reactions and cycle deterioration caused by repetitions of charge and discharge of the battery. The storage deterioration is deterioration that progresses with time regardless of charge and discharge due to the chemical reaction between, for example, an electrode and an electrolyte of the battery, and a progress degree of the storage deterioration is associated with a square root of time. In contrast, the cycle deterioration is deterioration that mechanically progresses due to friction of the electrode or the like and similar factor caused by expansion and contraction of the inside of the battery on the charge and discharge of the battery, and a progress degree of the cycle deterioration is associated with the number (the cycle) of the charge and the discharge. The battery deterioration degree estimating apparatus according to the embodiment estimates each of the storage deterioration degree and the cycle deterioration degree in the secondary use of the battery to add together, thus estimating a total deterioration degree of the battery. The following describes the detail.

<Estimation of Cycle Deterioration>

The cycle deterioration estimator 110 includes an output characteristics predictor 111 and a cycle-deterioration-degree in secondary-use estimator 112 (hereinafter referred to as simply a cycle deterioration degree estimator 112), and estimates the cycle deterioration degree in the secondary use caused by the charge and the discharge of the battery. The cycle deterioration progresses in proportion to the cycle (the number of charge/discharge). The number of charge/discharge of the battery for a certain period is assumed to be an integrated value of output characteristics (for example, an electric power or a current) for the certain period. Therefore, the output characteristics predictor 111 predicts the integrated value of the output characteristics in the secondary use on the basis of preliminary predictable load information in the secondary use. The predicted integrated value of the output characteristics is output to the cycle-deterioration-degree in secondary-use estimator 112.

The predicted integrated value of the output characteristics in the secondary use may be any of a charging power integrated value [kWh], a discharging power integrated value [kWh], an integrated value [kWh] of absolute values of the charging power and the discharging power, a charging current integrated value [Ah], a discharging current integrated value [Ah], and an integrated value [Ah] of absolute values of the charging current and the discharging current, in the secondary use period. Appropriate selection ensures improving estimation accuracy without additional cost.

Here, the load information in the secondary use is information on a use state of the battery assumed for each of model cases where at least one or more model cases are preliminarily configured as the usages of the battery in the secondary use. The information includes information for calculating the above-described integrated value of the output characteristics, such as the charging power [kw] and the discharging power [kw] predicted in the secondary use period, information on a charging percentage (SOC: State Of Charge) [%] of the battery and a temperature [° C.] in the secondary use period, and similar information. Note that, the model cases of the secondary use include not only the usage other than in-vehicle, for example, the usage as a stationary power source, but also the usage in-vehicle similarly to the primary use.

The cycle deterioration degree estimator 112 estimates the cycle deterioration degree in the secondary use on the basis of the predicted integrated value of the output characteristics in the secondary use and the cycle deterioration characteristics preliminarily configured and stored.

Figure 2:
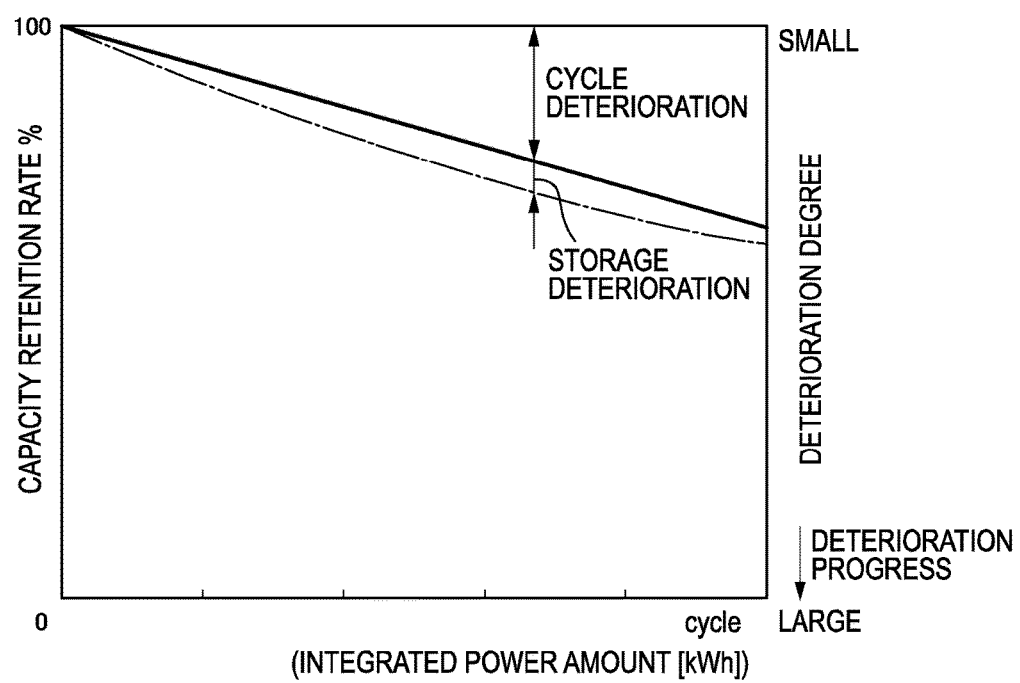
FIG. 2 is a drawing describing cycle deterioration characteristics.

Here, a setting method of the cycle deterioration characteristics will be described with reference to FIG. 2. A general cycle test for battery evaluation repeating the charge/discharge of the battery is performed to plot a relation between the cycle (the number of charge/discharge) and the deterioration degree. Even during the cycle test, the storage deterioration progresses due to the chemical reaction between the electrode and the electrolyte of the battery. Then, as illustrated in FIG. 2, it is important to configure the cycle deterioration characteristics except for the storage deterioration during the cycle test. Thus plotting the cycle deterioration characteristics indicates that a capacity retention rate decreases (deteriorates) as the cycle (the number of charge/discharge) increases. That is, it is found that the cycle deterioration degree is proportionate to the integrated value of the output characteristics. The capacity retention rate [%] is obtained by dividing a current value of a maximum chargeable capacity (hereinafter also referred to as a chargeable capacity, the chargeable capacity is electric quantity indicated by Ah and Wh) of the battery by a maximum capacity immediately after battery manufacture (state of new). That is, the capacity retention rate means a current chargeable capacity of the battery to the chargeable capacity of the battery immediately after manufacture. The deterioration degree [%] is a value indicated by a difference [%] between 100% and the above-described capacity retention rate, and that is, the deterioration degree [%] means a decrease rate [%] of the chargeable capacity after the start of the battery use.

Figure 3:
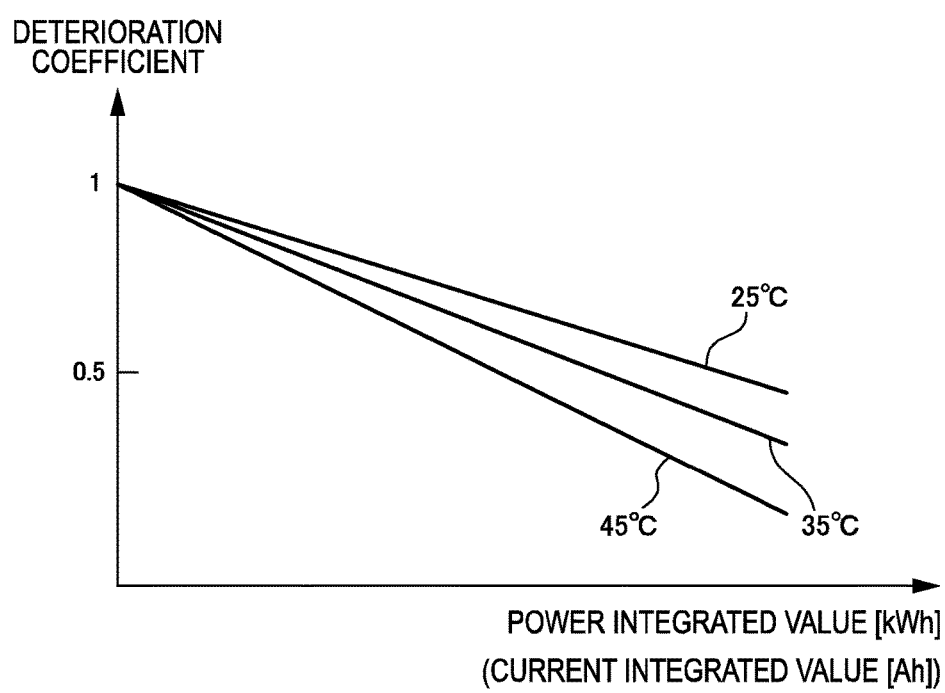
FIG. 3 is a drawing describing a temperature sensitivity of a cycle deterioration degree.

While the progress degree of the cycle deterioration is associated with the integrated value of the output characteristics, in addition to this, the progress degree of the cycle deterioration has sensitivity to a temperature. For example, as illustrated in FIG. 3, the higher the temperature is, the more easily the deterioration progresses. A deterioration coefficient on a vertical axis in FIG. 3 is a coefficient multiplied on the capacity retention rate. Accordingly, the cycle deterioration degree estimator 112 may estimate the cycle deterioration in consideration of information on the temperature [° C.] of the battery among the load information in the secondary use in addition to the integrated value, which is predicted by the output characteristics predictor 111, of the output characteristics in the secondary use and the cycle deterioration characteristics preliminarily configured and stored.

Here, the information on the temperature [° C.] of the battery according to the load information in the secondary use is information on a temperature transition of the battery in the secondary use period assumed for each of model cases where at least one or more model cases are preliminarily configured as the usages of the battery in the secondary use. The information on the temperature transition in the secondary use period is a predicted history (occurrence frequency of certain temperature) of the battery temperature in the secondary use period, and information predicting what temperature and how long the battery in the secondary use period will be exposed. For example, when the battery is secondarily used as a stationary power source in a facility, the information on the temperature transition in the secondary use period is information on the temperature transition in the facility at the secondary use.

The cycle deterioration degree estimator 112 uses the temperature information to correct the cycle deterioration degree. That is, when a period where the battery is in a high temperature state is long, the correction is performed such that the cycle deterioration progresses corresponding to the length. This correction ensures the estimation of the cycle deterioration degree of the battery with further high accuracy, thus ensuring more accurate estimation of the battery residual life. Since the temperature sensitivity is negligible depending on the battery characteristics, the correction is simply performed as necessary corresponding to the battery characteristics.

<Estimation of Storage Deterioration>

Next, the storage deterioration estimator 120 will be described. The storage deterioration estimator 120 of this embodiment includes a storage-deterioration-degree in primary-use storage unit 122 and a storage-deterioration-degree in secondary-use estimator 123.

The battery deterioration degree estimating apparatus 100 according to the present invention is characterized by including a controller programed to estimate the storage deterioration degree in the secondary use on the basis of information on a storage deterioration degree in the primary use from a start of battery use to a termination of the in-vehicle. The information on the storage deterioration degree in the primary use is at least any one of a storage deterioration degree already calculated at a time point before a start of the secondary use and information necessary for calculating the storage deterioration degree. The information on the storage deterioration degree of the battery in the primary use is stored in the storage-deterioration-degree in primary-use storage unit 122 (hereinafter also referred to as simply a storage deterioration degree storage unit 122). The storage deterioration degree storage unit 122 is, for example, a readable memory such as a RAM included in a battery controller attached to the battery. The battery controller is included in a battery pack that contains the battery.

Figure 4:
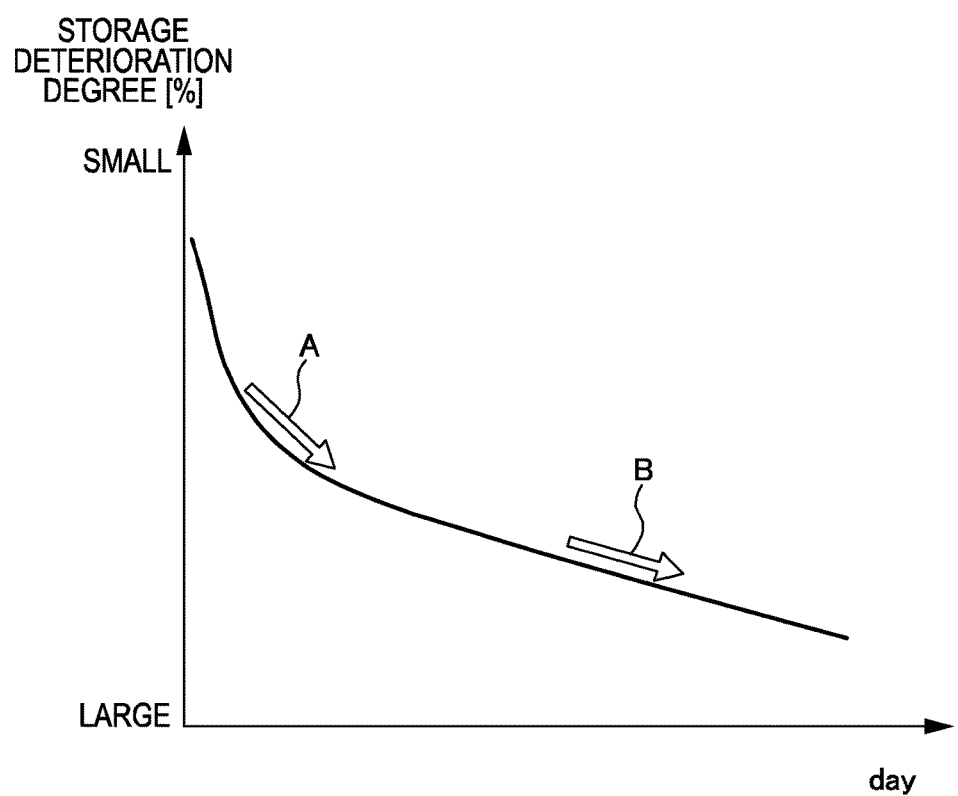
FIG. 4 is a drawing illustrating a progress curve of a storage deterioration degree.

Here, a description will be given of a reason to obtain the storage deterioration degree in the primary use for estimating the storage deterioration degree in the secondary use by referring to FIG. 4. FIG. 4 is a drawing illustrating a progress curve of the storage deterioration based on the storage deterioration characteristics of the battery. A horizontal axis indicates the number of days elapsed [day], and a vertical axis indicates the storage deterioration degree [%]. The curved line illustrated in the drawing indicates the storage deterioration degree [%] to the number of days elapsed [day], and a gradient of the curved line indicates an increase rate (deterioration speed) [%/√day] of the storage deterioration degree. As illustrated in the drawing, the storage deterioration degree is proportionate to a square root [√day] of the number of days elapsed. Since the storage deterioration degree does not linearly vary to the number of days elapsed, as indicated by arrows A and B in the drawing, gradients of the progress of the deterioration (that is, the increase rate of the deterioration degree) is different depending on the progress degree of the storage deterioration. Accordingly, for the accurate estimation of the storage deterioration degree in the secondary use, it is necessary to obtain the gradients of the progress of the storage deterioration at a time point of the estimation of the storage deterioration degree in the secondary use in advance. That is, the storage deterioration degree in the primary use is obtained to obtain the gradients of the progress of the storage deterioration at the starting time point of the secondary use.

Figure 5:
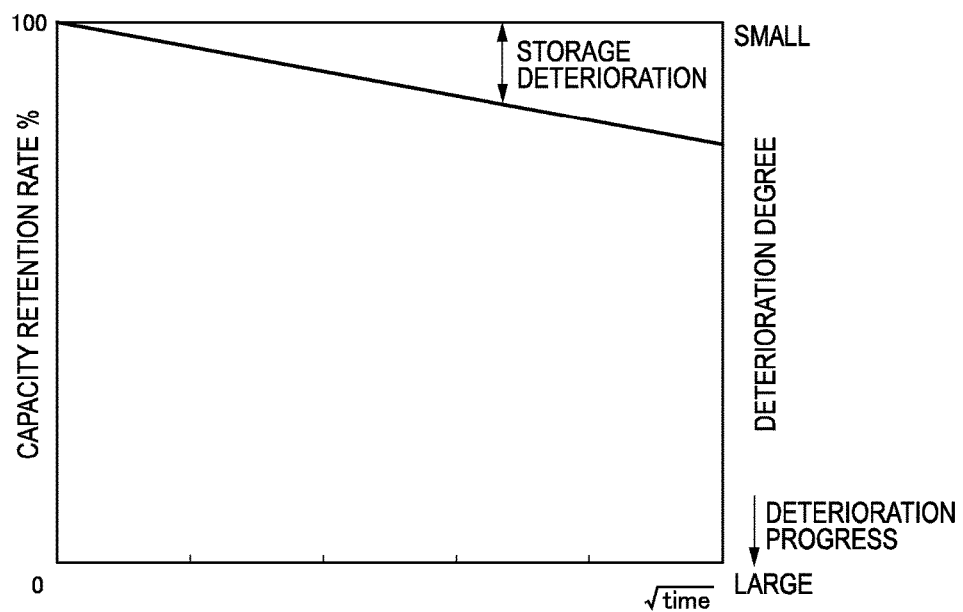
FIG. 5 is a drawing describing storage deterioration characteristics.

Subsequently, the storage deterioration degree will be described. The storage deterioration degree in the primary use is obtained by a storage-deterioration-degree in primary-use calculator, illustrated in FIG. 1, as a functional unit included in the battery controller. The storage deterioration degree in the primary use is calculated on the basis of an elapsed time from a time point where the electrode touches the electrolyte and the storage deterioration characteristics preliminarily configured and stored. The storage deterioration characteristics are, for example, characteristics illustrated in FIG. 5, and obtained through a general storage test of the battery evaluation. FIG. 5 indicates the characteristics where the storage deterioration progresses in proportion to the square root of time. Since measuring means for the elapsed time is a timer mounted to the vehicle, a period from a time point where the electrode touches the electrolyte in a battery manufacturing process to a start of measuring time by the vehicle timer cannot be measured. Therefore, the period from the time point where the electrode touches the electrolyte to the start of measuring time by the vehicle timer is simply managed to a certain period of time so as to add the certain period of time to the measured time period of the timer. Since the period from the time point where the electrode touches the electrolyte to the start of measuring time by the vehicle timer is very short compared with a product lifetime of the battery, the period may be ignored simply.

Figure 6:
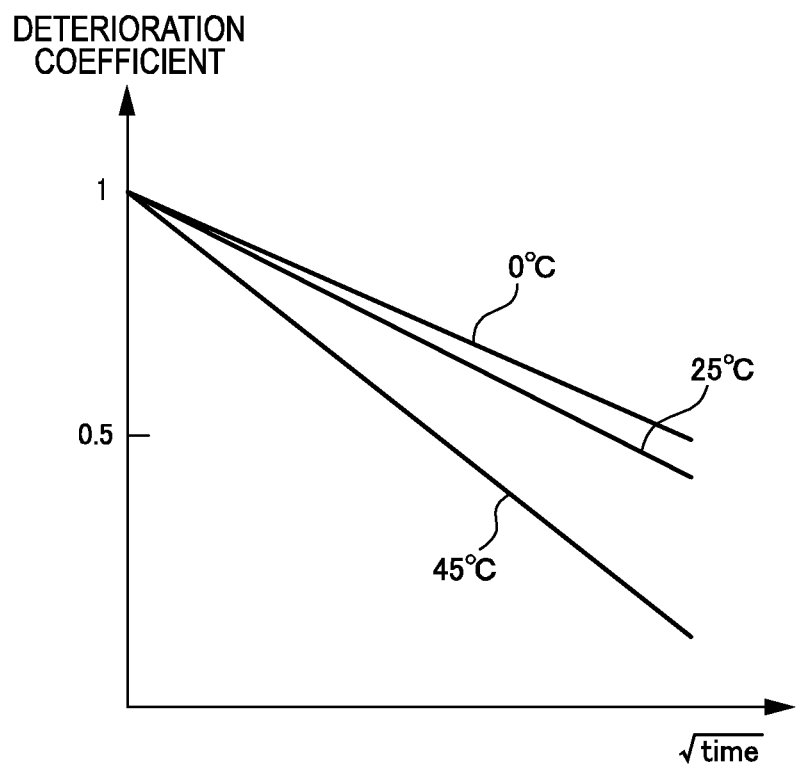
FIG. 6 is a drawing describing a temperature sensitivity of the storage deterioration degree.

The progress degree of the storage deterioration is proportional to the square root of time, and in addition, the progress degree of the storage deterioration has sensitivity to a temperature. For example, as illustrated in FIG. 6, the higher the temperature is, the more easily the deterioration progresses. A deterioration coefficient on a vertical axis in FIG. 6 is a coefficient multiplied on the capacity retention rate. The smaller the deterioration coefficient is, the smaller the capacity retention rate is, that is, the larger the storage deterioration degree is. The storage deterioration degree in the primary use obtained in this embodiment is calculated in consideration of the temperature sensitivity of the battery on the basis of information on a temperature transition of the battery in the primary use. The information on the temperature transition here is a history (occurrence frequency of certain temperature) of the battery temperature in the primary use period, and information capable of recognizing what temperature and how long the battery in the primary use period has been exposed. Measuring means of the temperature is, for example, a thermistor attached to the battery.

Figure 7:
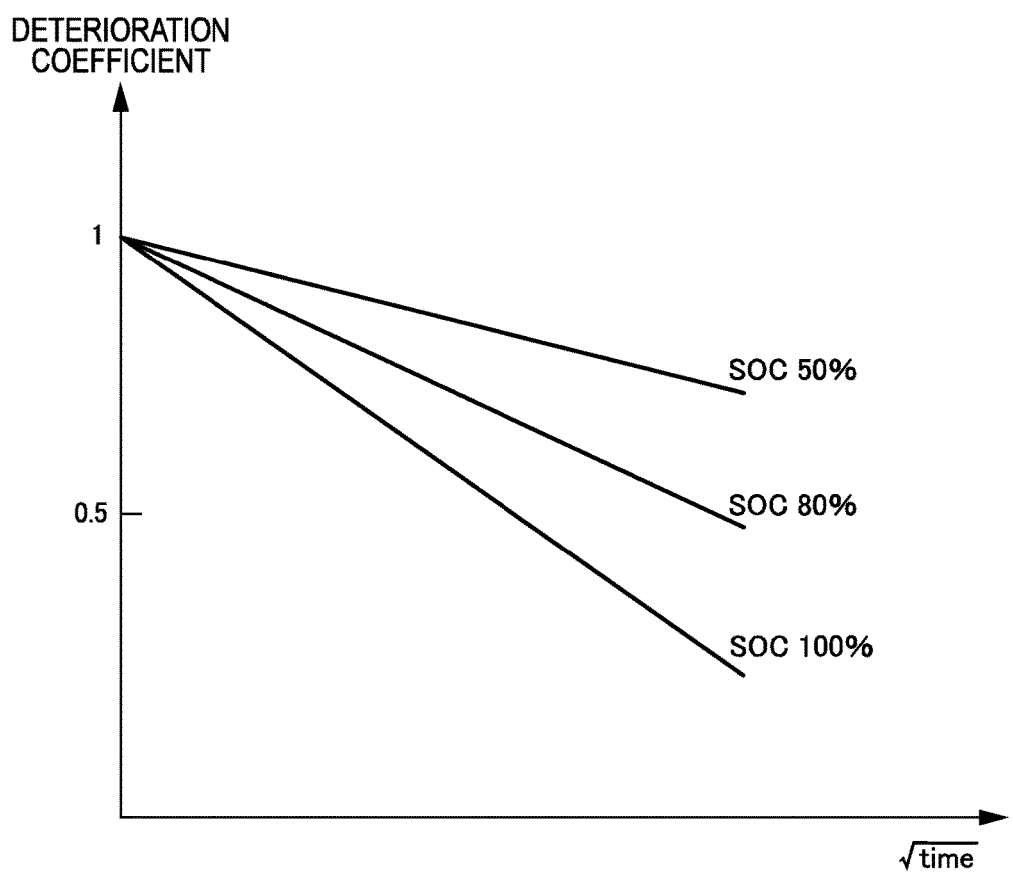
FIG. 7 is a drawing describing an SOC sensitivity of the storage deterioration degree.

Furthermore, the progress degree of the storage deterioration has sensitivity to an SOC (State Of Charge; charging percentage as a ratio of a remaining capacity to a full charging capacity) of the battery. For example, as illustrated in FIG. 7, the larger the SOC is, the more easily the deterioration progresses. A deterioration coefficient on a vertical axis in FIG. 7 is a coefficient multiplied on the capacity retention rate. The smaller the deterioration coefficient is, the smaller the capacity retention rate is, that is, the larger the storage deterioration degree is. The storage deterioration degree in the primary use obtained in this embodiment is calculated in consideration of the SOC sensitivity of the battery on the basis of information on an SOC transition of the battery in the primary use. The information on the SOC transition here is a history (occurrence frequency of certain SOC) of the battery SOC in the primary use period, and information capable of recognizing what state of a degree of SOC [%] and how long the battery in the primary use period has been exposed. As measuring means of the SOC, a general method is simply employed for the measuring using a voltage detected by a voltage sensor attached to the battery or the amount of current detected by an ammeter and the like attached to the battery.

Thus, the storage deterioration degree storage unit 122 of this embodiment stores the storage deterioration degree in the primary use calculated in consideration of the temperature history and the SOC history in the primary use period in addition to the elapsed time from the time point where the electrode touches the electrolyte and the storage deterioration characteristics preliminarily configured and stored.

Figure 8:
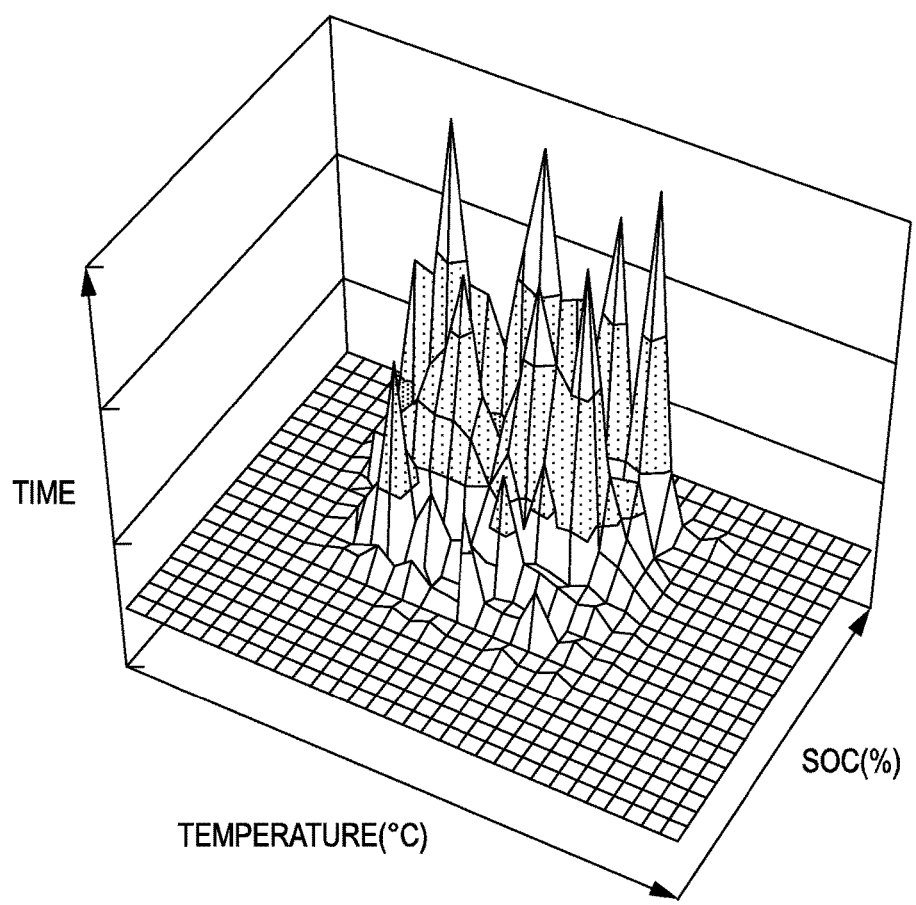
FIG. 8 is a drawing mapping a temperature history and an SOC history of a battery.

The information stored in the storage deterioration degree storage unit 122 may be information necessary for calculating the storage deterioration degree as described above. In this case, the storage deterioration degree storage unit 122 stores the temperature history and the SOC history of the battery in the primary use period, which are mapped as illustrated in FIG. 8 for example, in addition to the elapsed time from the time point where the electrode touches the electrolyte and the storage deterioration characteristics preliminarily configured and stored. However, when the storage deterioration degree in the primary use is estimated in the storage deterioration degree estimator 123 according to the embodiment, an equivalent temperature [° C.] and an equivalent SOC [%] in the primary use period, which can be calculated on the basis of the temperature history and the SOC history in the primary use period, may be used. Such information readably stored in the storage deterioration degree storage unit 122 ensures the storage deterioration degree estimator 123 (hereinafter referred to as simply the storage deterioration degree estimator 123) described later to estimate the storage deterioration degree in the secondary use on the basis of the information stored in the storage deterioration degree storage unit 122.

The equivalent temperature [° C.] is a temperature under a condition where the temperature is constant in a predetermined time period, such that a storage deterioration equivalent to a storage deterioration occurring after a lapse of a predetermined time period under a predetermined temperature environment occurs. That is, the equivalent temperature [° C.] means a temperature when a temperature environment in a predetermined time period where certain storage deterioration occurs is replace to a constant temperature environment.

Similarly, the equivalent SOC [%] is an SOC in a state where the SOC is constant in a predetermined time period, such that a storage deterioration equivalent to a storage deterioration occurring after a lapse of a predetermined time period under a predetermined SOC state occurs. That is, the equivalent SOC [%] means an SOC when an SOC state in a predetermined time period where certain storage deterioration occurs is replace to a constant SOC state.

The storage deterioration degree estimator 123 uses the following (1) formula to estimate the storage deterioration degree in the secondary use on the basis of the above-described information on the storage deterioration degree in the primary use and preliminarily assumed load information in the secondary use. The load information in the secondary use here is information on the equivalent SOC [%] and the equivalent temperature [° C.] of the battery in the secondary use period, the information is assumed to model cases configured as usages in the secondary use.

[Numerical Expression 1]

$$\sqrt{t_1 \times K_1(T_1, SOC_1)^2 + t_2 \times K_2(T_2, SOC_2)^2}$$

Figure 9:
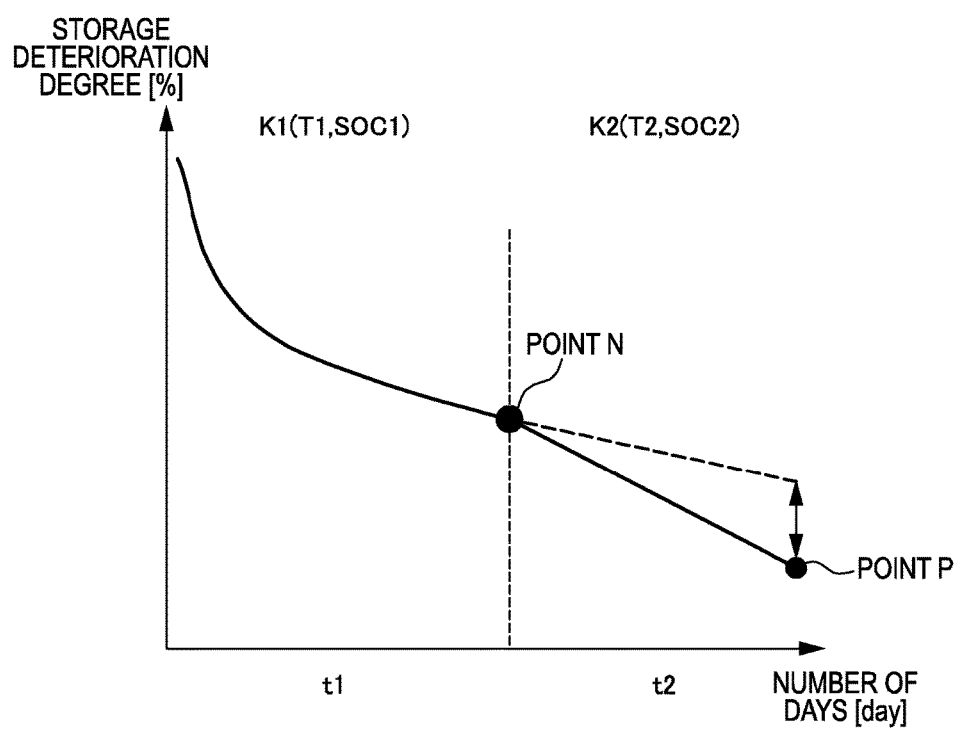
FIG. 9 is a drawing describing a concept of a formula (1)

$t_1$: the number of days [day] of primary use period
$t_2$: the number of days [day] of secondary use period
$K1(T_1, SOC_1)$: storage deterioration speed [%/√day] in primary use period
$K2(T_2, SOC_2)$: storage deterioration speed [%/√day] in secondary use period
$T_1$: battery equivalent temperature [° C.] in primary use
$T_2$: battery equivalent temperature [° C.] in secondary use
$SOC_1$: battery equivalent SOC [%] in primary use
$SOC_2$: battery equivalent SOC [%] in secondary use Here, with reference to FIG. 9, a concept of the formula (1) will be described. A horizontal axis in FIG. 9 indicates the number of days [day], and a vertical axis indicates the storage deterioration degree [%].

In the formula (1) and at a horizontal axis in FIG. 9, t1 indicates the number of days [day] of the primary use period. A storage deterioration speed in the primary use period is indicated as K1(T1, SOC1) [%/√day]. The K1 is preliminarily obtained through an experiment and the like, and a deterioration coefficient unique to each battery having parameters of the temperature and the SOC. Calculating a square root of a value obtained by multiplying a square of K1 (T1, SOC1) [%/√day] by the number of days t1 [day] of the primary use period provides the storage deterioration degree [%] in the primary use. The obtained storage deterioration degree [%] in the primary use is indicated by a point N in FIG. 9.

Note that, the square root of t1×K1 (T1, SOC1)$^2$ in the formula (1) is the storage deterioration degree [%] in the primary use. When the information stored in the storage deterioration degree storage unit 122 is information for calculating the storage deterioration degree, that is, such as the temperature history and the SOC history in the primary use period, substituting the equivalent temperature [° C.] and the equivalent SOC [%] in the primary use, which are calculated from the obtained temperature history and SOC history in the primary use period, for the parameters of the parameter and the SOC on K1 (T1, SOC1) [%/√day] provides the storage deterioration degree [%] in the primary use.

In the formula (1) and at the horizontal axis in FIG. 9, t2 indicates the number of days [day] in the secondary use period. A storage deterioration speed in the secondary use period is indicated as K2(T2, SOC2) [%/√day]. The K2 is, similarly to the K1, preliminarily obtained through an experiment and the like, and a deterioration coefficient unique to each battery having parameters of the temperature and the SOC. Since the batteries in the primary use and the secondary use are identical, the K1 and the K2 may be considered to be the identical value. However, since a slight variation possibly occurs depending on the use period of the battery, the use condition, and similar condition, the K2 may be calculated again before starting the secondary use for more improving the accuracy of the calculation of the storage deterioration degree in the secondary use period.

Substituting the equivalent SOC [%] and the equivalent temperature [° C.] of the battery in the secondary use period for K2 (T2, SOC2) [%/√day], multiplying a square of a value obtained by the substitution by the number of days t2 [day] in the secondary use period, and calculating a square root of the product provide the storage deterioration degree [%] in the secondary use period, that is, a variation rate [%] to the storage deterioration degree on an ending time point of the primary use period. Accordingly, as indicated by the formula (1), obtaining a square root of a sum of $t_1 \times K_1(T_1, SOC_1)^2$ and $t_2 \times K_2(T_2, SOC_2)^2$ ensures estimating the storage deterioration degree [%] where the storage deterioration degree [%] in the primary use is added by the predicted storage deterioration degree [%] in the secondary use period, that is, the storage deterioration degree of the battery in the secondary use. The obtained storage deterioration degree [%] in the secondary use is indicated by a point P in FIG. 9.

A dotted line indicated in a range of the t2 [day] in FIG. 9 indicates the storage deterioration speed [%/√day] in the secondary use period in the case of an estimation without considering the temperature and the SOC in the secondary use period. As indicated by a difference between the dotted line and a solid line to the point P, considering the temperature sensitivity and the SOC sensitivity of the battery in the secondary use period ensures the estimation of the storage deterioration degree with high accuracy. Since the temperature sensitivity and the SOC sensitivity are negligible depending on the battery characteristics, the consideration is simply applied as necessary corresponding to the battery characteristics.

It should be noted that, in the above description, it is premised that a storage period of the battery from the termination of the primary use to the start of the secondary use is approximately zero, and the progress of the storage deterioration in this period is not particularly taken into consideration. However, when the period is long to the extent having an influence on the estimation accuracy of the storage deterioration degree in the secondary use, the storage deterioration degree in the secondary use may be estimated considering the storage deterioration degree that progresses in the period.

<Calculation of Total Deterioration Degree of Battery on Secondary Use Start>

The total-deterioration-degree at secondary-use-start calculator (the total-deterioration-degree at reuse-start calculator) 130 calculates the total deterioration degree [%] at a starting time point of the secondary use. The total deterioration degree [%] at the time point of the secondary use start is a sum of the storage deterioration degree [%] and the cycle deterioration degree [%] at a time point of the primary use termination (that is, at the time point of the secondary use start). Note that, the capacity retention rate [%] at the time point of the primary use termination is calculable by subtracting the total deterioration degree [%] at the time point of the primary use termination (that is, the time point of the secondary use start) from 100%.

<Calculation of Total Deterioration Degree in Secondary Use>

Then, the total-deterioration-degree detector 140 adds the cycle deterioration degree [%] in the secondary use obtained by the cycle deterioration estimator 110, the storage deterioration degree [%] in the secondary use obtained by the storage deterioration estimator 120, and the total deterioration degree [%] at the time point of the secondary use start calculated by the capacity total-deterioration-degree at secondary-use-start calculator 130, thus estimating the battery total deterioration degree in the secondary use.

It should be noted that, as described above, since the total deterioration degree [%] is the difference between 100% and the capacity retention rate, calculating the total deterioration degree [%] is equal to calculating the capacity retention rate [%]. Multiplying a maximum chargeable capacity (Ah or Wh) at the battery production by the calculated capacity retention rate ensures calculating a maximum chargeable capacity of the battery. Additionally, since the capacity retention rate (that is, the total deterioration degree) is correlated to an internal resistance of the battery, the internal resistance can be calculated from the capacity retention rate.

As described above, the battery deterioration degree estimating apparatus 100 of the first embodiment uses the information on the battery deterioration degree in an in-vehicle period to estimate the deterioration degree of the battery in reuse. The battery deterioration degree estimating apparatus 100 includes the storage deterioration degree estimator 123 that estimates the storage deterioration degree of the battery in reuse on the basis of the information on the storage deterioration degree of the battery in the in-vehicle period and the load information of the battery in reuse, the cycle deterioration degree estimator 112 that estimates the cycle deterioration degree of the battery in reuse on the basis of the load information of the battery in reuse, and the total-deterioration-degree at secondary-use-start calculator 130 that calculates the total deterioration degree of the battery at the time point of reuse start. The battery deterioration degree estimating apparatus 100 includes the total-deterioration-degree detector 140 that estimates the total deterioration degree of the battery after the reuse start on the basis of the storage deterioration degree in reuse, the cycle deterioration degree in reuse, and the total deterioration degree of the battery at the time point of the reuse start. Thus, estimating the storage deterioration degree in reuse on the basis of the storage deterioration degree of the battery in the primary use (in the in-vehicle period), estimating the cycle deterioration degree in reuse, and adding the estimated values to estimate the total deterioration degree in reuse ensure the accurate estimation of the battery deterioration degree in reuse, thus improving the estimation accuracy of the battery product lifetime. Consequently, an application plan of battery reuse ensures being appropriately configured, thus reducing the increase of the inventory control cost of the battery.

The battery deterioration degree estimating apparatus 100 of the first embodiment further includes the storage deterioration degree storage unit 122 that stores the information on the storage deterioration degree of the battery in the in-vehicle period. The storage deterioration degree storage unit 122 is a storage medium attached to the battery, and the information on the storage deterioration degree of the battery in the in-vehicle period includes the information on the transitions of the temperature and the charging percentage (SOC) of the battery in the in-vehicle period and the storage deterioration characteristics having the correlation relationship with the storage deterioration degree. The storage deterioration degree estimator 123 obtains the information on the storage deterioration degree of the battery in the in-vehicle period from the storage deterioration degree storage unit 122. This ensures the estimation of the battery deterioration degree in the secondary use simply having the battery pack alone that includes the memory storing the information on the storage deterioration degree in the primary use.

According to the battery deterioration degree estimating apparatus 100 of the first embodiment, the load information includes the information on the transitions of the temperature and the charging percentage of the battery in reuse. The storage deterioration degree estimator 123 estimates the storage deterioration degree in reuse on the basis of the information on the storage deterioration degree of the battery in the in-vehicle period and the information on the transitions of the temperature and the charging percentage of the battery in reuse. This ensures the estimation with higher accuracy of the storage deterioration degree of the battery in the secondary use considering the temperature sensitivity and the SOC sensitivity to the storage deterioration of the battery, thus more accurately estimating the battery residual life.

According to the battery deterioration degree estimating apparatus 100 of the first embodiment, the load information further includes the output characteristics information of the battery in reuse. The cycle deterioration degree estimator 112 estimates the cycle deterioration degree in reuse on the basis of the integrated value of the output characteristics calculated from the output characteristics information and the preliminarily stored cycle deterioration characteristics. This eliminates a need for using the cycle deterioration degree information in the primary use in the estimation of the deterioration degree in reuse, thus reducing a computation load to shorten the processing time.

According to the battery deterioration degree estimating apparatus 100 of the first embodiment, the integrated value of the output characteristics is any of the integrated value of the charging power, the integrated value of the discharging power, the integrated value of the absolute values of the charging power and the discharging power, the integrated value of the charging current, the integrated value of the discharging current, and the integrated value of the absolute values of the charging current and the discharging current, in reuse. This ensures appropriately selecting the integrated value of the output characteristics used in the calculation of the cycle deterioration degree, thus improving estimation accuracy without additional cost.

According to the battery deterioration degree estimating apparatus 100 of the first embodiment, the cycle deterioration degree estimator 112 corrects the cycle deterioration degree in reuse on the basis of the information on the transition of the temperature of the battery in reuse. This ensures the estimation with higher accuracy of the cycle deterioration degree of the battery in the secondary use considering the temperature sensitivity to the cycle deterioration of the battery, thus more accurately estimating the battery residual life.

Second Embodiment

The following describes a battery deterioration degree estimating apparatus 100 of a second embodiment, especially on the difference from the first embodiment described above with reference to FIG. 10.

Figure 10:
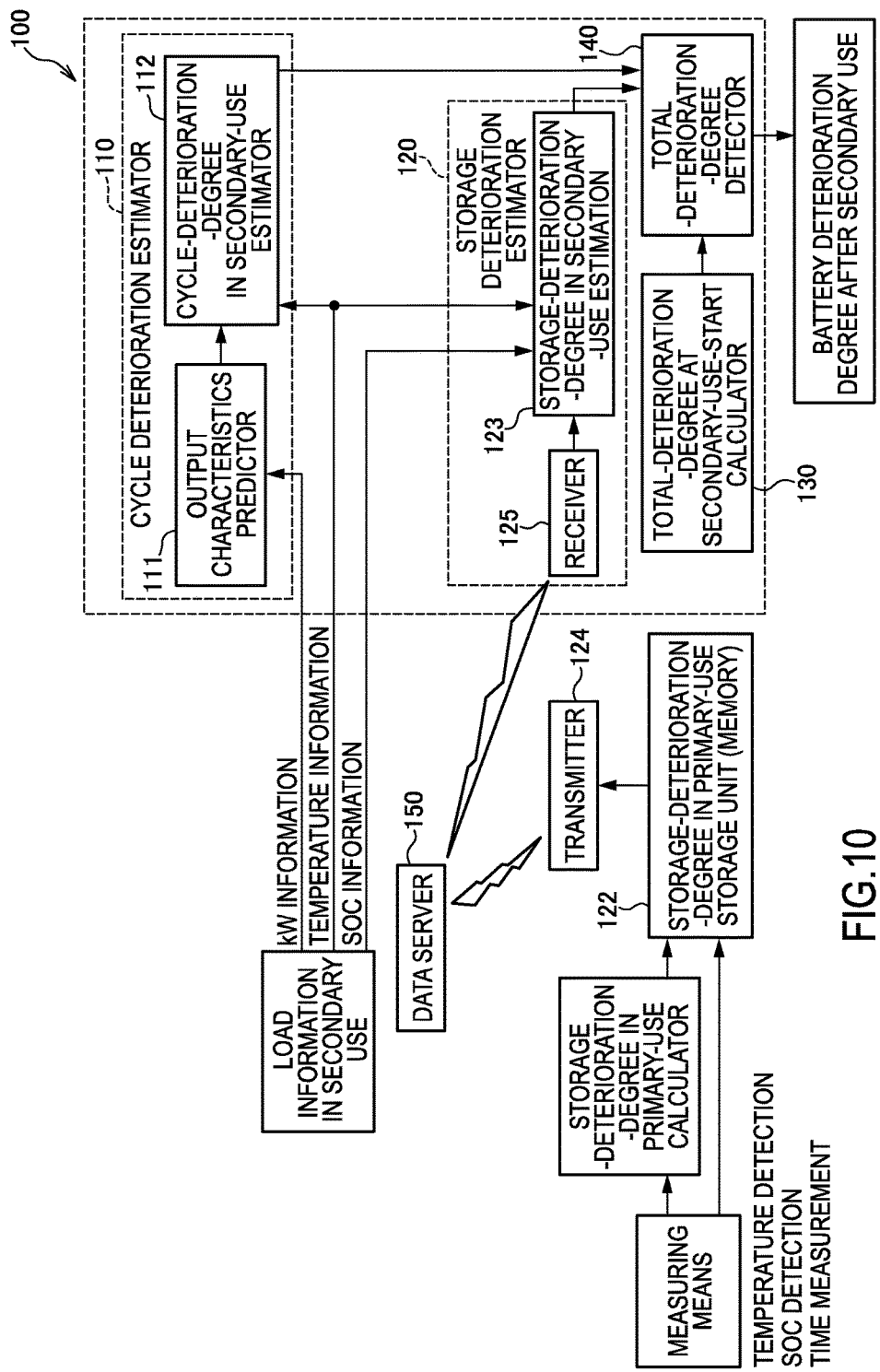
FIG. 10 is a block diagram illustrating a configuration of a battery deterioration degree estimating apparatus of a second embodiment.

FIG. 10 is a block diagram illustrating a configuration of the battery deterioration degree estimating apparatus 100 of the second embodiment. The battery deterioration degree estimating apparatus 100 of this embodiment is different from the first embodiment in the method of obtaining the information on the storage deterioration degree in the primary use in the storage deterioration estimator 120. With this difference, the storage deterioration degree storage unit 122 included in the first embodiment is removed from a configuration included in the battery deterioration degree estimating apparatus 100 of this embodiment.

First, similarly to the first embodiment, the information on the storage deterioration degree in the primary use is stored in the storage deterioration degree storage unit 122. In this embodiment, the information on the storage deterioration degree in the primary use stored in the storage deterioration degree storage unit 122 is transmitted to a data server 150 via a transmitter 124.

The transmitter 124 transmits the information on the storage deterioration degree in the primary use stored in the storage deterioration degree storage unit 122 to the data server 150 described later. The transmitter 124 is a communication function, for example, configured in a car navigation system included in a vehicle.

The data server 150 functions as what is called a telematics system that is a system where the information on the storage deterioration degree in the primary use stored in the storage deterioration degree storage unit 122 is obtained/stored via a data transmitter/receiver (not illustrated) and the stored information is shared with a vehicle and the like communicative with the data server 150. The data server 150 of this embodiment is communicative with the storage deterioration estimator 120 described later, and transmits the information on the storage deterioration degree in the primary use to the storage deterioration estimator 120 regularly or corresponding to a request from the storage deterioration estimator 120.

The storage deterioration estimator 120 includes a receiver 125. The receiver 125 functions as an information communication unit. Then, the storage deterioration degree estimator 123 obtains the information on the storage deterioration degree in the primary use from the data server 150 via the receiver 125.

As described above, the battery deterioration degree estimating apparatus 100 of the second embodiment further includes the receiver 125 communicative with a storage device disposed outside the vehicle including the battery, the storage device stores the information on the storage deterioration degree of the battery in the in-vehicle period. The information on the storage deterioration degree of the battery in the in-vehicle period includes the information on the transitions of the temperature and the charging percentage of the battery in the in-vehicle period and the storage deterioration characteristics having the correlation relationship with the storage deterioration degree. The storage deterioration degree estimator 123 obtains the information on the storage deterioration degree of the battery in the in-vehicle period via the receiver 125. This ensures obtaining the information on the storage deterioration degree in the primary use by data communication, thus reducing man-hour for direct data collection from the battery pack.

The embodiments of the present invention described above is merely illustration of some application examples of the present invention and not of the nature to limit the technical scope of the present invention to the specific constructions of the above embodiments.

The invention claimed is:

1. A battery deterioration degree estimating apparatus that uses information on battery deterioration degree in an in-vehicle period to estimate a deterioration degree of the battery in reuse, the battery deterioration degree estimating apparatus comprising:
    a storage deterioration degree estimator configured to estimate a storage deterioration degree of the battery in reuse on the basis of information on a storage deterioration degree of the battery in the in-vehicle period and load information of the battery in reuse;
    a cycle deterioration degree estimator configured to estimate a cycle deterioration degree of the battery in reuse on the basis of the load information of the battery in reuse;
    a total-deterioration-degree at reuse-start calculator configured to calculate a total deterioration degree of the battery at a time point of reuse start; and
    a total-deterioration-degree estimator configured to estimate a total deterioration degree of the battery after the reuse start on the basis of the storage deterioration degree in reuse, the cycle deterioration degree in reuse, and the total deterioration degree of the battery at the time point of the reuse start.

2. The battery deterioration degree estimating apparatus according to claim 1, further comprising
    a storage deterioration degree storage unit configured to store information on the storage deterioration degree of the battery in the in-vehicle period, wherein:
    the storage deterioration degree storage unit is a storage medium attached to the battery,
    the information on the storage deterioration degree of the battery in the in-vehicle period includes information on transitions of temperature and charging percentage of the battery in the in-vehicle period and storage deterioration characteristics having correlation relationship with the storage deterioration degree,
    the storage deterioration degree estimator obtains the information on the storage deterioration degree of the battery in the in-vehicle period from the storage deterioration degree storage unit, and the storage deterioration degree estimator estimates the storage deterioration degree of the battery in reuse on the basis of the information on the transitions of the temperature and the charging percentage of the battery in the in-vehicle period, the storage deterioration characteristics having correlation relationship with the storage deterioration degree, and the information on the storage deterioration degree of the battery in the in-vehicle period.

3. The battery deterioration degree estimating apparatus according to claim 1, further comprising
an information communication unit configured to communicate with a storage device disposed outside a vehicle including the battery, the storage device storing the information on the storage deterioration degree of the battery in the in-vehicle period, wherein:
the information on the storage deterioration degree of the battery in the in-vehicle period includes information on transitions of temperature and charging percentage of the battery in the in-vehicle period and storage deterioration characteristics having correlation relationship with the storage deterioration degree,
the storage deterioration degree estimator obtains the information on the storage deterioration degree of the battery in the in-vehicle period via the information communication unit, and the storage deterioration degree estimator estimates the storage deterioration degree of the battery in reuse on the basis of the information on the transitions of the temperature and the charging percentage of the battery in the in-vehicle period, the storage deterioration characteristics having correlation relationship with the storage deterioration degree, and the information on the storage deterioration degree of the battery in the in-vehicle period.

4. The battery deterioration degree estimating apparatus according to claim 1, wherein:
the load information includes the information on transitions of temperature and charging percentage of the battery in reuse, and
the storage deterioration degree estimator estimates a storage deterioration degree in reuse on the basis of the information on the storage deterioration degree of the battery in the in-vehicle period and the information on the transitions of the temperature and the charging percentage of the battery in reuse.

5. The battery deterioration degree estimating apparatus according to claim 1, wherein:
the load information further includes output characteristics information of the battery in reuse, and
the cycle deterioration degree estimator estimates the cycle deterioration degree in reuse on the basis of an integrated value of output characteristics calculated from the output characteristics information and preliminarily stored cycle deterioration characteristics.

6. The battery deterioration degree estimating apparatus according to claim 5, wherein
the integrated value of the output characteristics is any of an integrated value of a charging power, an integrated value of a discharging power, an integrated value of absolute values of the charging power and the discharging power, an integrated value of a charging current, an integrated value of a discharging current, and an integrated value of absolute values of the charging current and the discharging current, in reuse.

7. The battery deterioration degree estimating apparatus according to claim 5, wherein
the cycle deterioration degree estimator corrects the cycle deterioration degree in reuse on the basis of the information on the transition of the temperature of the battery in reuse.

8. A battery deterioration degree estimating method that uses information on battery deterioration degree in an in-vehicle period to estimate a deterioration degree of the battery in reuse, the battery deterioration degree estimating method comprising:
estimating a storage deterioration degree of the battery in reuse on the basis of information on a storage deterioration degree of the battery in the in-vehicle period and load information of the battery in reuse;
estimating a cycle deterioration degree of the battery in reuse on the basis of the load information of the battery in reuse;
calculating a total deterioration degree of the battery at a time point of reuse start; and
estimating a total deterioration degree of the battery after the reuse start on the basis of the storage deterioration degree in reuse, the cycle deterioration degree in reuse, and the total deterioration degree of the battery at the time point of the reuse start.

* * * * *